US008608918B2

(12) United States Patent
Kondo et al.

(10) Patent No.: US 8,608,918 B2
(45) Date of Patent: *Dec. 17, 2013

(54) MAGNET STRUCTURE AND CATHODE ELECTRODE UNIT FOR MAGNETRON SPUTTERING, AND MAGNETRON SPUTTERING SYSTEM

(75) Inventors: Takahiko Kondo, Takarazuka (JP); Keisuke Kondo, legal representative, Suita (JP); Takanobu Hori, Takarazuka (JP); Yasukuni Iwasaki, Takarazuka (JP); Nobuo Yoneyama, Takarazuka (JP)

(73) Assignee: Shinmaywa Industries, Ltd., Takarazuka-shi (JP)

( * ) Notice: Subject to any disclaimer, the term of this patent is extended or adjusted under 35 U.S.C. 154(b) by 1000 days.

This patent is subject to a terminal disclaimer.

(21) Appl. No.: 12/067,908

(22) PCT Filed: Aug. 23, 2006

(86) PCT No.: PCT/JP2006/316472
§ 371 (c)(1),
(2), (4) Date: Sep. 18, 2009

(87) PCT Pub. No.: WO2007/037079
PCT Pub. Date: Apr. 5, 2007

(65) Prior Publication Data
US 2010/0230282 A1    Sep. 16, 2010

(30) Foreign Application Priority Data

Sep. 29, 2005  (JP) ................................ 2005-283701

(51) Int. Cl.
*H01J 37/34* (2006.01)
(52) U.S. Cl.
USPC ................................ 204/298.12; 204/298.19
(58) Field of Classification Search
None
See application file for complete search history.

(56) References Cited

U.S. PATENT DOCUMENTS

| 4,865,708 A * | 9/1989 | Welty ....................... 204/298.19 |
| 5,399,253 A | 3/1995 | Grunenfelder |

(Continued)

FOREIGN PATENT DOCUMENTS

| JP | 62-072121 | 4/1987 |
| JP | 2-118750 | 5/1990 |

(Continued)

OTHER PUBLICATIONS

Chareles Jensen, Erik Bard, U.S. Appl. No. 60/667,250, filed Mar. 31, 2005, Magnetic Head for Mobile Miniature X-ray source.*

(Continued)

*Primary Examiner* — Emily Le
*Assistant Examiner* — Jenny Wu
(74) *Attorney, Agent, or Firm* — Marshall, Gerstein & Borun LLP

(57) ABSTRACT

A magnet structure and the like are provided, which can reduce the labor required to make a magnet design for producing a tunnel-shaped leakage magnetic field for plasma confinement in a well-balanced manner over an obverse surface of a target, based on a quadridirectional magnetic field produced by magnetic interaction between plural magnets. The magnet structure (110) includes: inner and outer magnets (10 and 13) positioned at a reverse surface side of a target (20) to have different magnetic moment orientations for producing a first magnetic force line reaching an obverse surface (20A) of the target (20); a pair of intermediate magnets (11 and 12) positioned at the reverse surface side of the target (20) and between the inner and outer magnets (10 and 13) to have different magnetic moment orientations, for producing a second magnetic force line acting to cancel a widthwise magnetic flux density component which is produced by the first magnetic force line; and a magnetic member (24) positioned at the reverse surface side of the target (20) to guide the second magnetic force line emanating from an end surface of one of the pair of intermediate magnets (11 and 12) into an end surface of the other, the magnetic member (24) being configured to produce a magnetic force line reaching an intermediate point in a thickness direction of the target (20) in association with the inner magnet (10) or the outer magnet (13).

12 Claims, 9 Drawing Sheets

(56) References Cited

U.S. PATENT DOCUMENTS

| | | | |
|---|---|---|---|
| 5,415,754 A | 5/1995 | Manley | |
| 6,096,180 A | 8/2000 | Sichmann | |
| 6,432,285 B1 | 8/2002 | Kastanis et al. | |
| 7,628,899 B2 * | 12/2009 | White et al. | 204/298.17 |
| 2004/0140204 A1 * | 7/2004 | Navala et al. | 204/298.2 |
| 2004/0262147 A1 * | 12/2004 | Windisch et al. | 204/192.1 |
| 2006/0065525 A1 | 3/2006 | Weichart | |
| 2007/0025516 A1 * | 2/2007 | Bard et al. | 378/138 |
| 2010/0230282 A1 | 9/2010 | Kondo et al. | |

FOREIGN PATENT DOCUMENTS

| | | | | |
|---|---|---|---|---|
| JP | 03-202464 | 9/1991 | | |
| JP | 04276069 A | 10/1992 | | |
| JP | 04-329874 | 11/1992 | | |
| JP | 5-179440 | 7/1993 | | |
| JP | 05179440 A | * 7/1993 | | C23C 14/35 |
| JP | 10-102246 A | 4/1998 | | |
| JP | 2002-363742 | 12/2002 | | |
| JP | 3473954 | 9/2003 | | |
| WO | WO 93/24674 | 12/1993 | | |

OTHER PUBLICATIONS

European search report from Application No. 06782925.9 dated Mar. 3, 2010.
International Search Report from PCT/JP2006/316472.
European search report from Application No. 06832416.9 dated Sep. 30, 2011.
International Search Report from PCT/J P2006/321950.

* cited by examiner

MAGNET STRUCTURE AND CATHODE ELECTRODE UNIT FOR MAGNETRON SPUTTERING, AND MAGNETRON SPUTTERING SYSTEM

CROSS-REFERENCE TO RELATED APPLICATIONS

This is the U.S. national phase of International Application No. PCT/JP2006/316472, filed Aug. 23, 2006, which claims the benefit of Japanese patent application No. 2005-283701, filed Sep. 29, 2005.

TECHNICAL FIELD

The present invention relates to a magnet structure and a cathode electrode unit for magnetron sputtering, and a magnetron sputtering system (hereinafter referred to as "magnet structure and the like"). More specifically, the invention relates to a technique for improving the magnet structure and the like for magnetron sputtering for the purpose of increasing target utilization efficiency.

BACKGROUND ART

A film formation method based on sputtering phenomenon in which ion (for example Ar ion) is caused to collide with a target material in a vacuum to cause atoms of the target to pop up from the target material and deposit on a substrate disposed opposite to the target material, is conventionally well-known.

According to a magnetron sputtering film formation method, which is one of methods based on the above sputtering phenomenon, a tunnel-shaped magnetic field is formed over a target surface to capture secondary electrons generated during a process of the sputtering phenomenon by Lorentz force and cause the secondary electrons to conduct their cycloid motion, thereby increasing a frequency of ionization collision of the secondary electrons with Ar gas. Thereby, high-density plasma is produced in a space lying in the vicinity of the target surface, thereby making a film formation rate higher.

Such a magnetron sputtering film formation method, however, has a drawback that, because a target material in a stronger magnetic field is locally eroded faster by the sputtering, a sputtering amount in a plane of the target material becomes non-uniform, decreasing target utilization efficiency. For this reason, various techniques have thus far been developed to overcome this drawback.

For example, a quadridirectional magnetic field producing technique has been proposed in which three magnets each having a N-S magnetic direction (i.e., magnetic moment) parallel with the target surface and two magnets each having a N-S magnetic direction perpendicular to the target surface are suitably combined together to produce in a target region a tunnel-shaped, closed-loop quadridirectional magnetic flux comprising upper, lower, inner and outer magnetic fluxes (hereinafter referred to as "quadridirectional magnetic field"), and thereby magnetic flux densities of these magnetic fluxes cancel each other so that a zero point at which a net magnetic flux density becomes zero can be positioned in the target region (see patent document 1).

According to such a magnetic field producing technique, uniformity of plasma in the target region (i.e., sputtering region) during erosion and removal of the target material by plasma discharge (i.e., glow discharge) is increased, improving the target utilization efficiency.

Patent document 1: Japanese Patent No. 3473954 specification (FIG. 3)

SUMMARY OF THE INVENTION

According to estimation by the inventors of the present invention, a great deal of trial-and-error labor is needed to make a magnet design for producing magnetic force lines of a quadridirectional magnetic field with respect to the target in a well-balanced manner, in order to apply the quadridirectional magnetic field as described in the patent document 1 as a plasma-confining leakage magnetic field for sputtering.

Specifically, a magnetic flux density component parallel with an obverse surface of the target (hereinafter referred to as "parallel magnetic flux density") of a leakage magnetic field leaking to the obverse surface of the target (i.e., the surface of the target that is opposed to the substrate) serves as a leakage magnetic field for plasma confinement.

To enable the target to be eroded efficiently and widely, a magnet structure has to be designed so as to be capable of producing a parallel magnetic flux density maintained at a predetermined magnetic flux density (e.g., 200 to 300 G) or higher over a proper region extending above and in the vicinity of the obverse surface of the target.

Further, with respect to a magnet structure configured to produce a magnetic flux density component perpendicular to the obverse surface of the target (hereinafter referred to as "perpendicular magnetic flux density") of the leakage magnetic field leaking to the obverse surface of the target on the precondition that a value of the parallel magnetic flux density is maintained at the above described density or higher, it is desired that the magnet structure be designed to slow down a change in the perpendicular magnetic flux density at a location above and in the vicinity of the obverse surface of the target so that the perpendicular magnetic flux density becomes a value close to zero over the proper region extending above and in the vicinity of the obverse surface side of the target, for the purpose of achieving wide erosion of the target by effective utilization of magnetic energy. For example, it is empirically known that when the perpendicular magnetic flux density is close to zero in a target region, this target region is eroded faster by the sputtering. Therefore, wide erosion of the target can be realized by obtaining a proper target region in which the perpendicular magnetic flux density is adjusted close to zero.

It is estimated that the quadridirectional magnetic field disclosed in the patent document 1 satisfies the requirement for both of horizontal magnetic flux density and perpendicular magnetic flux density by well-balanced magnetic interaction among multiple magnets (five magnets recited herein) having different magnetic moment orientations. The patent document 1, however, merely discloses a guideline for magnet design such that the zero point should be formed within the target.

Therefore, even the technique of the patent document 1 has not yet changed a situation where multiple design parameters associated with the plural magnets producing the quadridirectional magnetic field are determined based on a complicated interrelation between these parameters. Thus, the magnet design that satisfies the requirement for both of the horizontal magnetic flux density and the perpendicular magnetic flux density is still not easy even if the technique of patent document 1 is referred to.

Actually, such magnet design depends on a trial-and-error study in which repeated analysis modeling design (and verification experiments when necessary) of a static magnetic field is made by making use of a static magnetic field simulation technique based on experience of skilled technicians.

It is therefore desirable to provide a magnet structure and the like which make it possible to reduce a labor required to make a magnet design for producing a tunnel-shaped leakage magnetic field for plasma confinement in a well-balanced manner over an obverse surface of a target, based on a quadridirectional magnetic field produced by magnetic interaction among plural magnets.

In order to solve the above-described problem, the present invention provides a magnet structure for magnetron sputtering, comprising: inner and outer magnets positioned at a reverse surface side of a target to have different magnetic moment orientations, for producing a first magnetic force line reaching an obverse surface of the target; a pair of intermediate magnets positioned at the reverse surface side of the target and between the inner and outer magnets to have different magnetic moment orientations, for producing a second magnetic force line acting to cancel a magnetic flux density component in a width direction which is produced by the first magnetic force line; and a magnetic member positioned at the reverse surface side of the target to guide the second magnetic force line emanating from an end surface of one of the pair of intermediate magnets into an end surface of the other, and the magnetic member is configured to produce a magnetic force line reaching an intermediate point in a thickness direction of the target in association with the inner magnet or the outer magnet.

In one example of magnetization of such a magnetic member, the inner magnet and the magnetic member may cooperate with each other to produce a first intermediate magnetic force line reaching an intermediate point in the thickness direction of the target, and the outer magnet and the magnetic member may cooperate with each other to produce a second intermediate magnetic force line reaching an intermediate point in the thickness direction of the target so as to cancel a magnetic flux density component in the thickness direction of the target which is produced by the first intermediate magnetic force line.

With this configuration, it is possible to form a zero point, at which values of magnetic flux densities in the width direction and the thickness direction which are obtained by the first magnetic force line, the second magnetic force line, the first intermediate magnetic force line and the second intermediate magnetic force line become substantially zero, within a region surrounded by the magnetic force lines.

Such a magnet structure is capable of producing a quadridirectional magnetic field comprising the first and second magnetic force lines and the first and second intermediate magnetic force lines which surround the zero point over a suitable region of the target. Therefore, wide erosion can be achieved with localized sputtering of the target suppressed, increasing the target utilization efficiency.

With the magnet structure, the second magnetic force line of the quadridirectional magnetic field comprising the first and second magnetic force lines and the first and second intermediate magnetic force lines is confined within the magnetic member. For this reason, a path of the second magnetic force line is fixed so as to conform to the shape of the magnetic member. Therefore, it is possible to reduce the number of magnet design parameters for the respective magnets producing the quadridirectional magnetic field, thereby to reduce the labor required to make the magnet design for producing a well-balanced magnetic field.

Plural sets of the magnetic member and the pair of intermediate magnets associated with the magnetic member may be arranged in parallel between the inner and outer magnets along a reverse surface of the target.

In one example of magnetization of such magnetic members, the inner magnet and a first magnetic member located adjacent the inner magnet cooperate with each other to produce a first intermediate magnetic force line reaching an intermediate point in the thickness direction of the target; and the outer magnet and a second magnetic member located adjacent the outer magnet cooperate with each other to produce a second intermediate magnetic force line reaching an intermediate point in the thickness direction of the target.

In this case, the first magnetic member and the second magnetic member may cooperate with each other to produce a third intermediate magnetic force line reaching an intermediate point in the thickness direction of the target so as to cancel magnetic flux density components in the thickness direction of the target which are respectively produced by the first intermediate magnetic force line and the second intermediate magnetic force line.

With this configuration, it is possible to form a first zero point, at which values of magnetic flux densities in the width direction and the thickness direction which are obtained by the first magnetic force line, the second magnetic force line, the first intermediate magnetic force line and the third intermediate magnetic force line become substantially zero, within a region surrounded by the magnetic force lines, and a second zero point, at which values of magnetic flux densities in the width direction and the thickness direction which are obtained by the first magnetic force line, the second magnetic force line, the second intermediate magnetic force line and the third intermediate magnetic force line become substantially zero, within a region surrounded by the magnetic force lines.

Such a magnet structure is capable of producing a quadridirectional magnetic field comprising the first and second magnetic force lines and the first and third intermediate magnetic force lines which surround the first zero point over a suitable region of the target and another quadridirectional magnetic field comprising the first and second magnetic force lines and the second and third intermediate magnetic force lines which surround the second zero point over a suitable region of the target. Therefore, wide erosion can be achieved with localized sputtering of the target suppressed, increasing the target utilization efficiency.

With the magnet structure, the second magnetic force line of the quadridirectional magnetic field comprising the first and second magnetic force lines and the first and third intermediate magnetic force lines and the second magnetic force line of the quadridirectional magnetic field comprising the first and second magnetic force lines and the second and third intermediate magnetic force lines, are confined within the respective magnetic members. For this reason, the paths of the second magnetic force lines are fixed so as to respectively conform to the shapes of the magnetic members. Therefore, it is possible to reduce the number of magnet design parameters for the respective magnets producing such quadridirectional magnetic fields, thereby reducing the labor required to make the magnet design for producing well-balanced magnetic fields.

Further, this magnet structure is preferable because it allows a magnet design to be made, in which a proper number of magnetic members for confining the respective second magnetic force lines therein are arranged along the reverse surface of the target according to a width of the target.

The magnetic member may contact the end surfaces of the pair of intermediate magnets associated with the magnet member and may be shaped convexly protruding toward the reverse surface of the target.

An example of the magnetic member is curved like an arch.

Another example of the magnetic member is bent at a substantially right angle.

The present invention also provides a cathode electrode unit comprising: a target made of a non-magnetic metal; the magnet structure as recited above, which is positioned at a reverse surface side of the target; and an electric power source for supplying a predetermined electric power to the target.

The present invention also provides a magnetron sputtering system comprising a vacuum chamber accommodating therein the cathode electrode unit as recited above and a substrate opposed to the target of the cathode electrode unit, the vacuum chamber being capable of reducing an internal pressure thereof.

Since the above described cathode electrode unit and magnetron sputtering system are capable of improving the target utilization efficiency as described above, the target change periods can be prolonged. As a result, an operating efficiency of the cathode electrode unit and the magnetron sputtering system can be improved.

The foregoing and other features and advantages invention will become more apparent from the reading of the following detailed description of the invention in conjunction with the accompanying drawings.

According to the present invention, it is possible to provide a magnet structure and the like which are capable of reducing the labor required to make the magnet design for producing a tunnel-shaped leakage magnetic field for plasma confinement in a well-balanced manner over the obverse surface of the target, based on the quadridirectional magnetic field produced by magnetic interaction among plural magnets.

Figure 1:
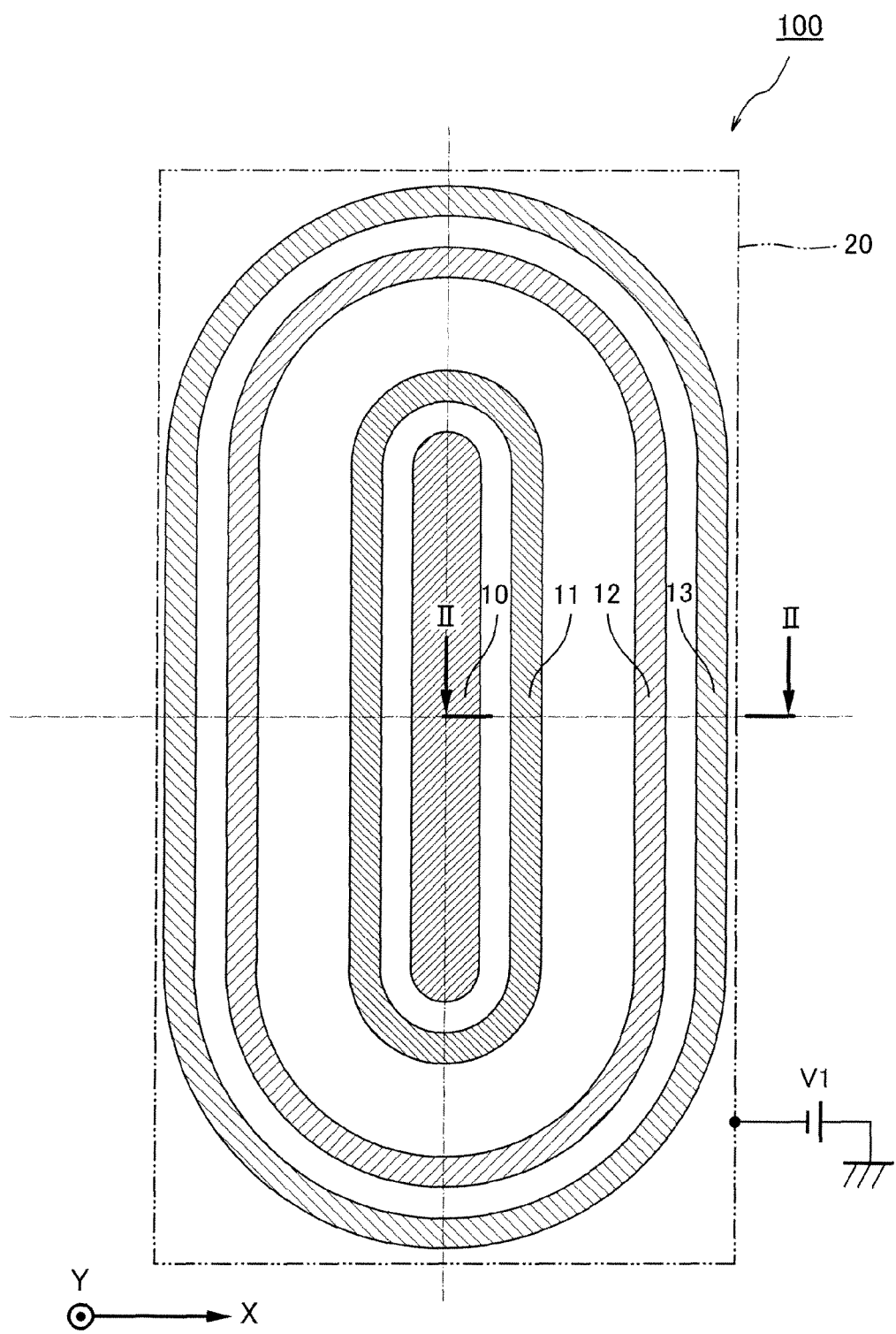
FIG. 1 is a plan view showing a cathode electrode unit including a magnet structure according to an embodiment 1 of the application.

DESCRIPTION OF REFERENCE NUMERALS 10,30 . . . central permanent magnet
11 . . . first intermediate permanent magnet
12 . . . second intermediate permanent magnet
13,35 . . . outermost permanent magnet
20,40 . . . target
21,41 . . . base
22,42 . . . first base piece
23,47 . . . second base piece
24 . . . curved magnetic member
25,50A,50B . . . upper magnetic force line
26,51A,51B . . . lower magnetic force line
27,52A,52B . . . inner intermediate magnetic force line
28,54A,53B . . . outer intermediate magnetic force line
29,54A,54B . . . zero point
31 . . . third intermediate permanent magnet
32 . . . fourth inter mediate permanent magnet
33 . . . fifth intermediate permanent magnet
34 . . . sixth intermediate permanent magnet
43 . . . third base piece
44 . . . fourth base piece
45 . . . fifth base piece
46 . . . sixth base piece
48 . . . first bending magnetic member
49 . . . second bending magnetic member
100,120 . . . cathode electrode unit
110,130 . . . magnet structure

DETAILED DESCRIPTION

Hereinafter, preferred embodiments 1 and 2 of the present invention will be described with reference to the drawings.

Embodiment 1

FIG. 1 is a plan view showing a cathode electrode unit including a magnet structure (i.e., magnetic field producing device) according to embodiment 1.

Figure 2:
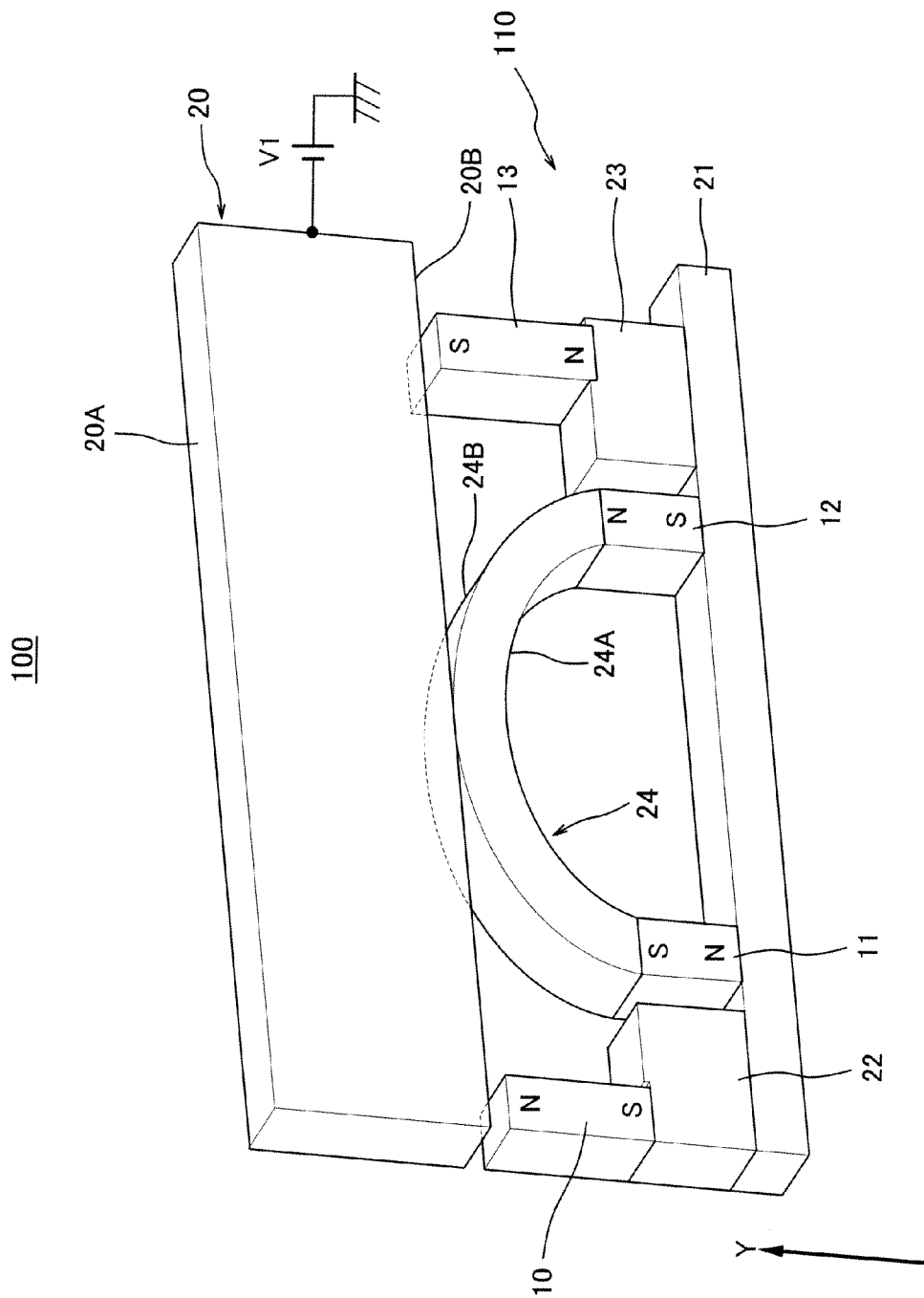
FIG. 2 is a perspective view of the cathode electrode unit taken along line II-II of FIG. 1.

FIG. 2 is a perspective view of the cathode electrode unit taken along line II-II of FIG. 1.

For simplification of the drawing, FIG. 1 shows a cross-section of a magnet portion of a magnet structure 110.

For convenience's sake, a width direction and a thickness direction of a target 20 are represented as X-direction and Y-direction, respectively, in FIGS. 1 and 2 (as well as in FIG. 3) for description of components of the cathode electrode unit 100.

Further, although the components of the magnet structure 110 are shown as being cut to a predetermined thickness in a depth direction (perpendicular to both the X-direction and the Y-direction) in FIG. 2, these components actually extend in the depth direction to have the same sectional shapes. This can be easily understood from FIG. 1.

According to the present embodiment, the cathode electrode unit 100 comprises as major components thereof, the rectangular target 20 made of a non-magnetic metal such as aluminum (Al), and the magnet structure 110 having plural magnets and positioned at a reverse surface 20B side of the target 20.

The target 20 is a parent material of a thin film to be coated over a substrate (not shown) positioned opposite to the target 20, and is supplied with an electric power from an electric power source V1 so as to serve as a cathode for the purpose of attracting Ar ion (positive ion) present in plasma.

In this embodiment, a vacuum chamber (not shown) for magnetron sputtering, which accommodates the cathode electrode unit 100 and an substrate therein and which is capable of reducing an internal pressure thereof, is grounded as an anode.

During a sputtering phenomenon, high-density plasma containing Ar ion is generated in the vicinity of the obverse surface of the target 20 by a tunnel-shaped leakage magnetic field for plasma confinement, while atoms forming the target 20 (i.e., aluminum atoms in the present embodiment) are beaten out of the target surface by collision energy of Ar ion and deposited on the substrate. Since such a technique is well known in the art, detailed description thereof is herein omitted.

The magnet structure 110 has a rectangular base 21 having substantially the same outside size as the target 20 in a plan view. Plural magnets and magnetic members (to be described in detail later) are disposed on the base 21 for producing a tunnel-shaped leakage magnetic field for plasma confinement in a space extending above and in the vicinity of the obverse surface 20A of the target 20.

Actually, the components (including the magnets and the magnetic member) of the magnet structure 110 and the target 20 are fixed to each other integrally by appropriate fixing device. Illustration and description of such fixing device are herein omitted.

Because the material selection for the base 21 may affect the strength of a leakage magnetic field leaking to the obverse surface 20A of the target 20, an appropriate material, for example, non-magnetic stainless steel or ferromagnetic stainless steel, is selected to form the base 21 in view of design specifications of other components of the magnet structure 110.

As shown in FIGS. 1 and 2, the magnet structure 110 includes, as a first main magnet, a central permanent magnet 10 (i.e., inner magnet) of a substantially rectangular shape positioned at the reverse surface 20B side of the target 20 in a center position in the width direction (i.e., X-direction) of the target 20. The central permanent magnet 10 is shaped like a rod with its longitudinal center line coinciding with the longitudinal center line of the target 20 in a plan view and is placed on an upper surface of a first base piece 22 resting on the base 21 shown in FIG. 2.

The central permanent magnet 10 has north and south poles producing a magnetic moment oriented in the direction opposite to the Y-direction (i.e., the direction from the obverse surface 20A toward the reverse surface 20B of the target 20), as shown in FIG. 2. The north-pole of the central permanent magnet 10 is opposed to a center portion of the reverse surface 20B of the target 20, while the south-pole of the central permanent magnet 10 is opposed to a center portion of the base 21 with the first base piece 22 interposed therebetween. The first base piece 22 is made of, for example, a ferromagnetic stainless steel material or a non-magnetic stainless steel material.

As shown in FIGS. 1 and 2, the magnet structure 110 includes, as a second main magnet, an outermost permanent magnet 13 (i.e., outer magnet) of a substantially elongate cylindrical shape positioned at the reverse surface 20B side of the target 20 inwardly of and in the vicinity of an end of the target 20 lying in the width direction (i.e., X-direction) of the target 20. The outermost permanent magnet 13 has an annular shape extending along the periphery of an end portion of the target 20 in a plan view and is placed on an upper surface of a second base piece 23 resting on the base 21 of FIG. 2.

The outermost permanent magnet 13 has north and south poles producing a magnetic moment oriented in the Y-direction (i.e., the direction from the reverse surface 20B toward the obverse surface 20A of the target 20), as shown in FIG. 2. The south-pole of the outermost permanent magnet 13 is opposed to a peripheral portion of the reverse surface 20B of the target 20, while the north-pole of outermost permanent magnet 13 is opposed to a peripheral portion of the base 21 with the second base piece 23 interposed therebetween. The second base piece 23 is made of, for example, a ferromagnetic stainless steel material or a non-magnetic stainless steel material.

As shown in FIGS. 1 and 2, the magnet structure 110 includes, as a first adjustment magnet, a first intermediate permanent magnet 11 of a substantially elongate cylindrical shape positioned at the reverse surface 20B side of the target 20. The first intermediate permanent magnet 11 is located between the central permanent magnet 10 and the outermost permanent magnet 13 and is positioned close to a center portion of the target 20 in the width direction (i.e., X-direction) of the target 20. The first intermediate permanent magnet 11 has an annular shape along the outer periphery of the central permanent magnet 10 in a plan view and is placed on an upper surface of the base 21 shown in FIG. 2.

The first intermediate permanent magnet 11 has north and south poles producing a magnetic moment oriented in the Y-direction (i.e., the direction from the reverse surface 20B toward the obverse surface 20A of the target 20), as shown in FIG. 2. The south-pole of the first intermediate permanent magnet 11 contacts one end surface of a curved magnetic member 24 (to be described later), while the north-pole of the first intermediate permanent magnet 11 contacts a surface of the base 21 that lies close to the center portion of the base 21.

As shown in FIGS. 1 and 2, the magnet structure 110 includes, as a second adjustment magnet, a second intermediate permanent magnet 12 of a substantially elongate cylindrical shape positioned at the reverse surface 20B side of the target 20. The second intermediate permanent magnet 12 is located between the central permanent magnet 10 and the outermost permanent magnet 13 and is positioned close to an end of the target 20 that lies in the width direction (i.e., X-direction) of the target 20. The second intermediate magnet 13 has an annular shape along the inner periphery of the outermost permanent magnet 13 in a plan view and is placed on the upper surface of the base 21 shown in FIG. 2.

The second intermediate permanent magnet 12 has north and south poles producing a magnetic moment oriented in the direction opposite to the Y-direction (i.e., the direction from the obverse surface 20A toward the reverse surface 20B of the target 20), as shown in FIG. 2. The north-pole of the second intermediate permanent magnet) 3 contacts the other end surface of the curved magnetic member 24, while the south-pole of the second intermediate permanent magnet 13 contacts a surface of the base 21 that lies close to an end of the base 21.

The permanent magnets 10, 11, 12 and 13 described above can be constructed using various known magnet materials. In cases where these permanent magnets 10, 11, 12 and 13 are used as being immersed in cooling water for cooling the reverse surface 20B of the target 20, it is desirable to provide the surfaces of the magnets with a rust-proof treatment or select a rust-proof material (e.g., ferrite magnet).

The curved magnetic member 24 (ferromagnetic member), which is made of a ferromagnetic stainless steel material or iron, is curved like a bow (or arch). As shown in FIG. 2, the curved magnetic member 24 has opposite end surfaces extending in parallel with the reverse surface 20B of the target 20 in such a manner that one end surface contacts the south-pole of the first intermediate permanent magnet 11, and the other end surface contacts the north-pole of the second intermediate permanent magnet 12. Thus, the curved magnetic member 24 bridges the two magnets 11 and 12.

The curved magnetic member 24 is of a substantially elongate and annular circle shape in a plan view. More specifically, the curved magnetic member 24 has curved inner and outer surfaces 24A and 24B which are curved at equal curvature convexly toward the reverse surface 20B of the target 20 in the thickness direction (i.e., Y-direction) of the target 20. The curved magnetic member 24 is in the form of a half obtained by cutting an imaginary annular cylindrical body having a substantially elongate-circle section into halves along the end surfaces so that a dimension between the curved inner and outer surfaces corresponds to a wall thickness of the annular cylindrical body.

The top of the curved outer surface in the Y-direction may be in contact with the reverse surface 20B of the target 20 or may be spaced apart from the reverse surface 20B by an appropriate clearance (not shown).

When the above two are in contact with each other, the distance between the target 20 and the first and second intermediate permanent magnets 11 and 12 is shortened so that magnetic energy contributing to the production of a magnetic field for plasma confinement, which are generated by the magnets 11 and 12, works effectively.

When an appropriate clearance is provided between the two, there is sometimes an advantage that reverse surface 20B of the target 20 is cooled with cooling water. For example, in cases where such a cooling structure is employed in which the magnet structure 110 is entirely immersed in cooling water stored in a cooling water vessel (not shown), cooling water is flowed in the clearance, so that efficient heat exchange between cooling water and the reverse surface 20B of the target 20 is suitably carried out. In cases where such a cooling structure is employed in which a rectangular hollow backing plate (not shown) for passage of cooling water is in contact with the reverse surface 20B of the target 20, such a clearance is indispensable as a space into which the backing plate is inserted.

Description will be made of a result of analysis of a magnetic flux density distribution over the above-described target 20 magnetized, by making use of a static magnetic field simulation technique.

An analytical model having substantially the same shape as shown in FIG. 2 is mesh-divided into unit analytical areas for numerical calculation, and is created on a computer. Appropriate physical property data on respective materials and boundary condition data have been input to mesh areas including mesh area corresponding to the respective components of the magnet structure 110, mesh area corresponding to the target 20 and boundary mesh areas.

In this embodiment, note that the physical property input data includes data obtained when a ferromagnetic material is employed as the material for any one of the base 21 and the first and the second base pieces 22 and 23.

As an analytical solver, general-purpose magnetic field analysis software ("MagNet" manufactured by INFOLYTICA CORPORATION) has been used.

Figure 3:
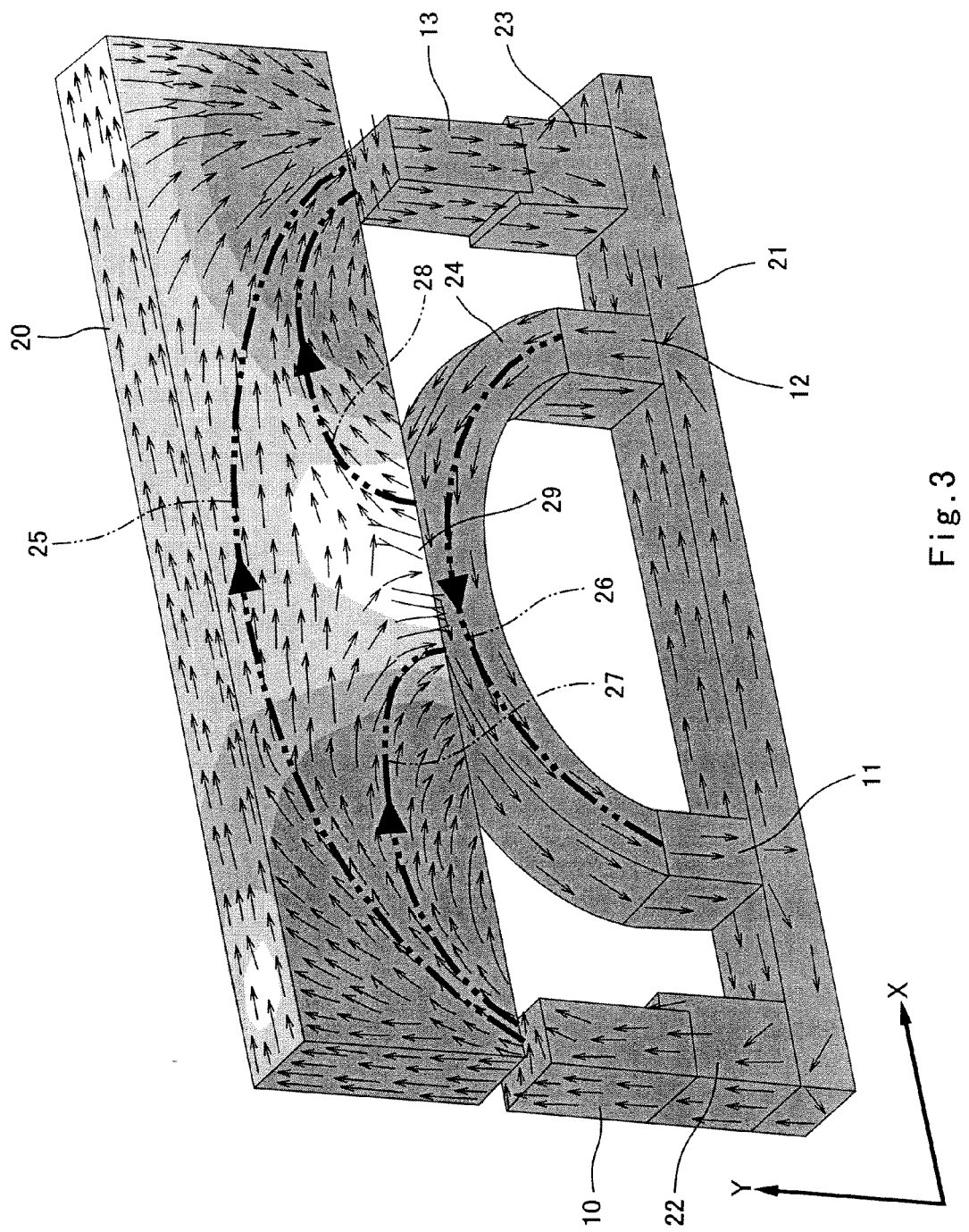
FIG. 3 is a view showing one exemplary result of analysis on the magnet structure according to the embodiment 1 by a static magnetic field simulation technique.
Figure 4:
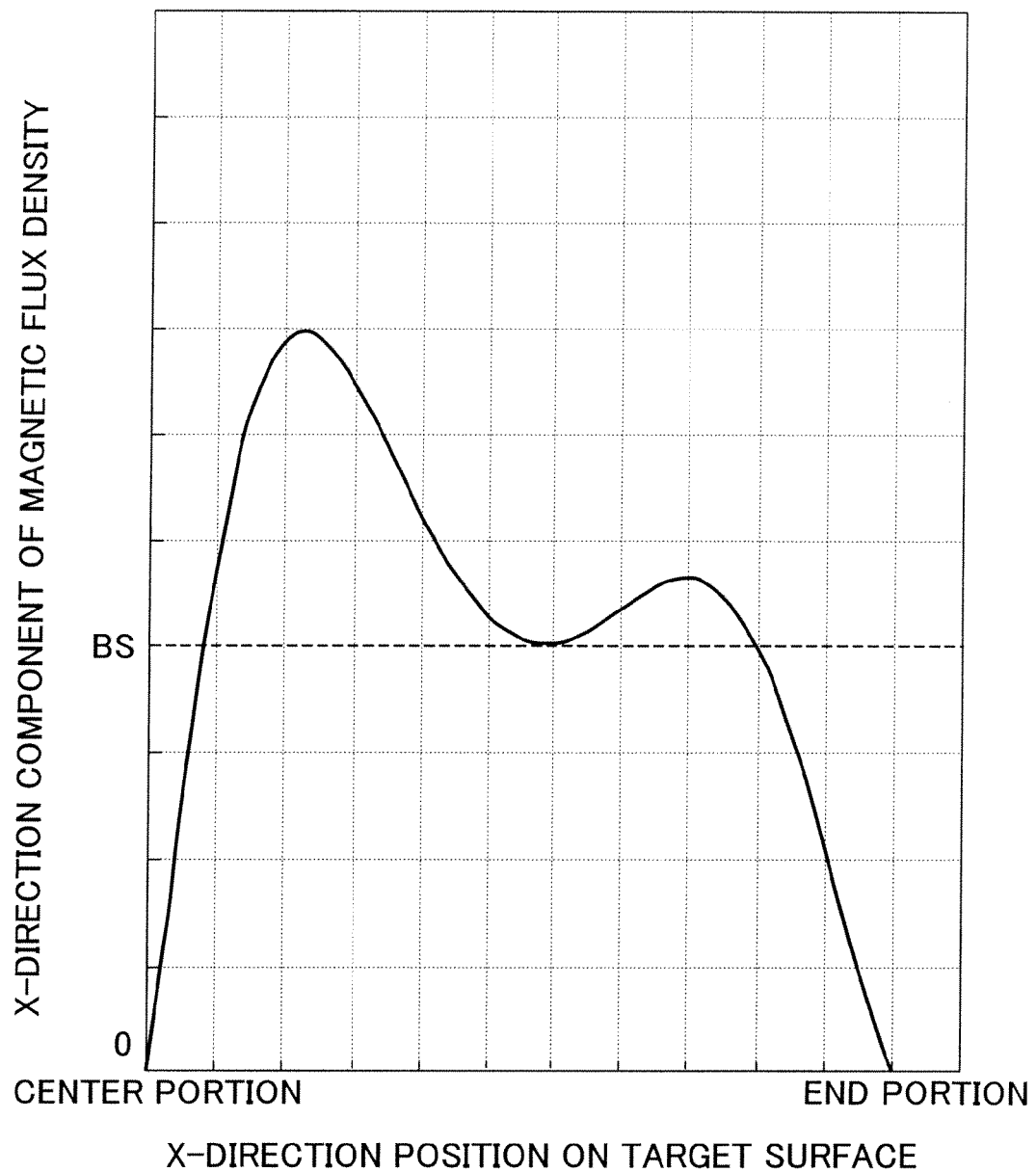
FIG. 4 is a view showing one exemplary result of analysis on a magnet structure according to the embodiment 1 by the static magnetic field simulation technique.
Figure 5:
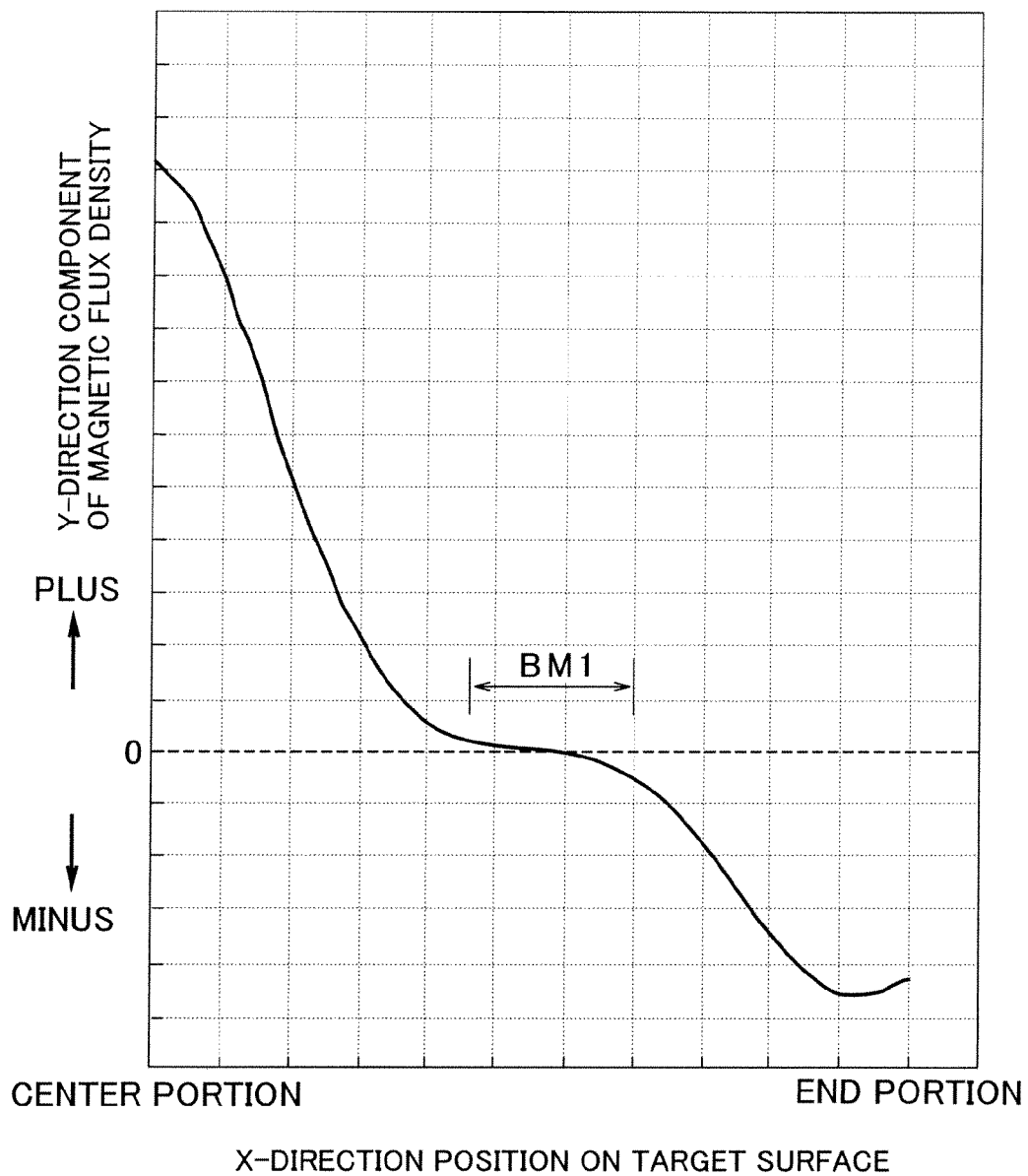
FIG. 5 is a view showing one exemplary result of analysis on the magnet structure according to the embodiment 1 by the static magnetic field simulation technique.

FIGS. 3, 4 and 5 are views each showing one exemplary result of analysis on the magnet structure according to the present embodiment by the static magnetic field simulation technique.

FIG. 3 illustrates a magnetic flux density distribution (constant-height surfaces) and magnetic flux density vectors (indicated by arrows) in the analytical model, with a magnetic flux density distribution and magnetic flux density vectors in the space being omitted.

In FIG. 4, a horizontal axis represents a X-direction position on the target surface and a vertical axis represents a X-direction component of magnetic flux density on the target surface, and the relationship between the two is plotted using numerical data obtained from the result of analysis.

In FIG. 5, a horizontal axis represents the X-direction position on the target surface and the vertical axis represents the Y-direction component of magnetic flux density on the target surface, and the relationship between the two is plotted using numerical data obtained from the result of analysis.

A gray-scale magnetic flux density contour figure (constant-height view) shown in FIG. 3 represents a high-low distribution of a total (absolute value) of vector components of the magnetic flux density (i.e., magnetic flux density distribution). The contour view shows that the magnetic flux density rises with transition from a lighter gray region to a deeper gray region (The upper limit of magnetic flux density is set to 500 G). As can be seen from such magnetic flux density contour figure and vector view, a magnetic force line as a curve on which the tangential direction at each point coincides with the magnetic field direction at that point is understood.

FIG. 3 shows the magnetic flux density contour figure and vector view in accordance with those output from the analytical computer. For easy understanding of these views, however, FIG. 3 simplifies the magnetic flux density distribution output from the computer while adding bold apparent two-dotted lines representing each of an upper magnetic force line 25 (i.e., first magnetic force line), a lower magnetic force line 26 (i.e., second magnetic force line), an inner intermediate magnetic force line 27 (i.e., first intermediate magnetic force line) and an outer intermediate magnetic force line 28 (i.e., second intermediate magnetic force line).

According to FIG. 3, the upper magnetic force line 25 and the lower magnetic force line 26 are produced so as to cancel each other's X-direction vector component of magnetic flux density (in the width direction of the target 20) within the target 20, while the inner intermediate magnetic force line 27 and the outer intermediate magnetic force line 28 are produced so as to cancel each other's Y-direction vector component of magnetic flux density (in the thickness direction of the target 20) within the target 20.

Specifically, the upper magnetic force line 25 emanates from the north pole of the central permanent magnet 10, reaches the obverse surface 20A of the target 20, extends substantially in parallel with the X-direction in an inside portion of the target 20 that lies just above a zero point 29 at which the Y-direction vector component of magnetic flux density and the X-direction vector component of magnetic flux density become substantially zero, and enters the south pole of the outermost permanent magnet 13 while curving like an arch within the target 20.

The lower magnetic force line 26 emanates from the north pole of the second intermediate permanent magnet 12, extends substantially in parallel with the direction opposite to the X-direction while being confined in an inside portion of the curved magnetic member 24 that lies just below the zero point 29, and enters the south pole of the first intermediate permanent magnet 11 while curving like an arch so as to conform to the shape of the curved magnetic member 24.

A magnetic circuit is formed to include the lower magnetic force line 26, magnetic force lines each passing through inside of the first and second intermediate permanent magnets 11 and 12, and a magnetic force line passing through the inside of the base 21.

The inner intermediate magnetic force line 27 emanates from the north pole of the central permanent magnet 10, reaches an intermediate point in the thickness direction of the target 20, extends to bend like an arch within the target 20, passes through a portion of the target 20 that lies beside the zero point 29 (location on the minus side in the X-direction with respect to the zero point 29) substantially in parallel with the direction opposite to the Y-direction, and enters the curved magnetic member 24.

The outer intermediate magnetic force line 28 emanates from the curved magnetic member 24, passes through the portion of the target 20 that lies beside the zero point 29 (location on the plus side in the X-direction with respect to the zero point 29) substantially in parallel with the Y-direction, reaches an intermediate point in the thickness direction of the target 20, extends to bend like an arch within the target 20, and enters the south pole of the outermost permanent magnet 13.

Thus, the zero point 29 is formed within a region surrounded by these magnetic force lines 25 to 28, as shown in FIG. 3. In this embodiment, the zero point 29 is located in the vicinity of a contact point between the reverse surface 20B of the target 20 and the top of the curved magnetic member 24.

By thus positioning the zero point 29 at a location optimum to the constitution of the target 20 (thickness, material and the like), it is possible to correctly adjust the leakage magnetic field for plasma confinement produced over the obverse surface 20A of the target 20.

As can be seen from FIG. 4, the magnet structure 110 described above is capable of maintaining the X-direction component of magnetic flux density (i.e., the component in the width direction of the target 20) on the obverse surface 20A of the target 20 to a value not less than a predetermined magnetic flux density BS (e.g., 200 to 300 G) over substantially the entire X-direction region of the obverse surface 20A of the target 20. As a result, efficient and wide erosion of the target 20 can be achieved advantageously.

Further, as can be seen from FIG. 5, a flat region BM1, at which the Y-direction component of magnetic flux density (i.e., the component in the thickness direction of the target 20) on the obverse surface 20A of the target 20 becomes substantially zero, can be formed over a proper region in the X-direction of the obverse surface 20A of the target 20. As a result, the magnet structure 110 enables effective utilization of magnetic energy and wide erosion of the target 20 advantageously.

Thus, the magnet structure 110 according to the present embodiment is capable of producing a quadridirectional magnetic field comprising the upper magnetic force line 25, the lower magnetic force line 26, the inner intermediate magnetic force line 27 and the outer intermediate magnetic force line 28 which surround the zero point 29 existing at a suitable location in the target 20 (for example, a location in the vicinity of the reverse surface 20B). Therefore, the magnet structure 110 makes it possible to realize wide erosion with localized sputtering of the target 20 suppressed, thereby to increase the target utilization efficiency, hence, prolong the target change periods. Thus, the magnet structure 110 can contribute to an improvement in the operating efficiency of a planar-type magnetron sputtering system.

According to the present embodiment, the lower magnetic force line 26 of the quadridirectional magnetic field comprising the upper magnetic force line 25, the lower magnetic force line 26, the inner intermediate magnetic force line 27 and the outer intermediate magnetic force line 28 is confined within the curved magnetic member 24. For this reason, the path of the lower magnetic force line 26 is fixed so as to conform to the shape of the curved magnetic member 24. Therefore, it becomes possible to reduce the number of magnet design parameters for the respective magnets producing such a quadridirectional magnetic field, thereby to reduce the labor required to make a magnet design for producing a well-balanced magnetic field.

Embodiment 2

Figure 6:
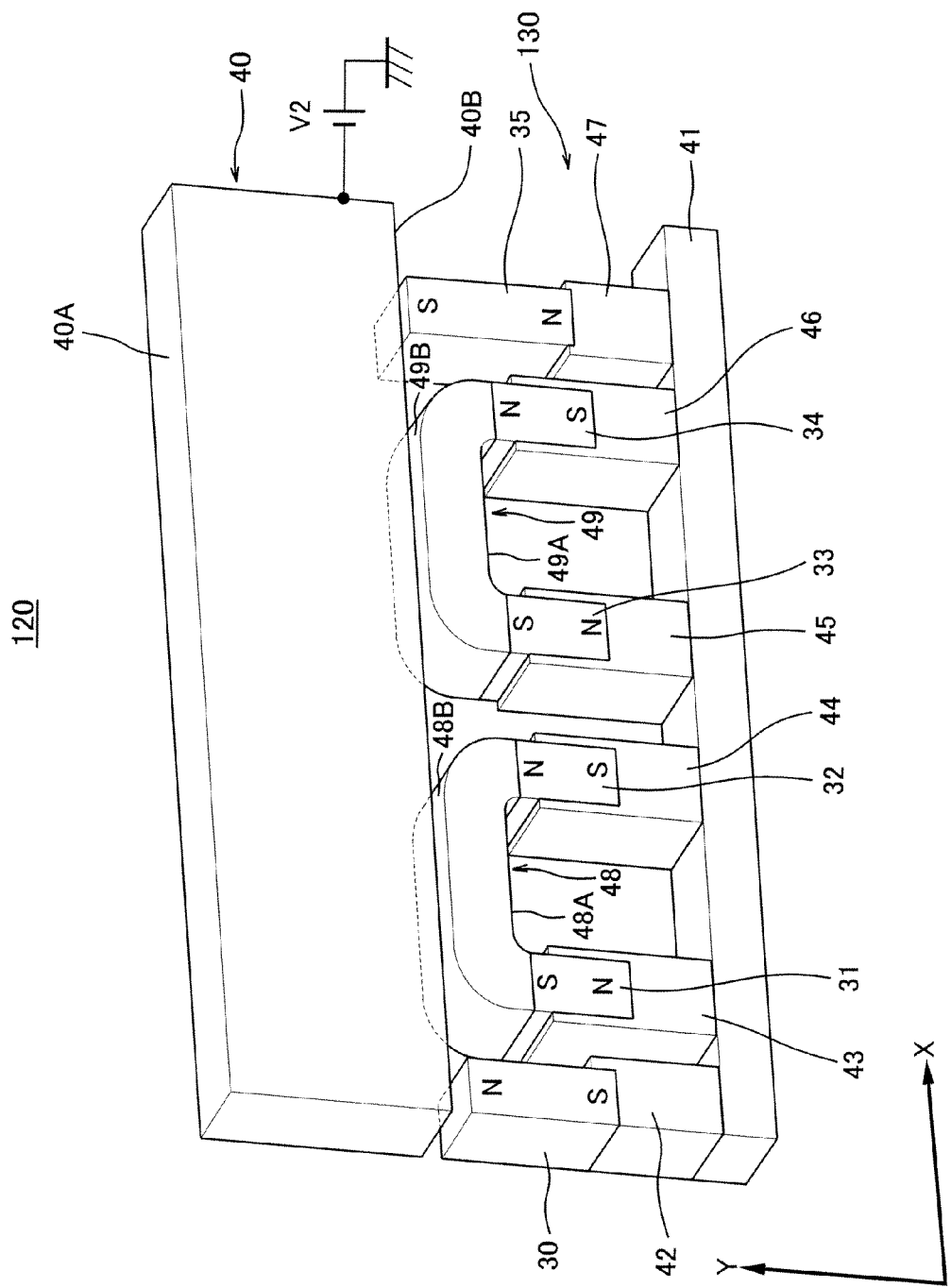
FIG. 6 is a perspective view showing a cathode electrode unit including a magnet structure according to an embodiment 2 of the application.

FIG. 6 is a perspective view showing a cathode electrode unit including a magnet structure according to the embodiment 2. FIG. 6 corresponds to FIG. 2 having been referred to for embodiment 1.

A target 40, a base 41, an electric power source V2, a central permanent magnet 30, an outermost permanent magnet 35 and base pieces 42 and 47 of a cathode electrode unit 120 according to the present embodiment are substantially the same as the target 20, the base 21, the electric power source V1, the central permanent magnet 10, the outermost permanent magnet 13 and the base pieces 22 and 23 according to the embodiment 1. Therefore, description of these components will be omitted.

A structure of the magnet structure 130 in a plan view will also be omitted, because the plan-view structure of the magnet structure 130 according to the embodiment 2 can be understood with reference to FIG. 1 of the embodiment 1.

As shown in FIG. 6, the magnet structure 130 has four adjustment magnets, i.e., third to sixth intermediate permanent magnets 31 to 34 each having a substantially elongate cylindrical shape, at a reverse surface 40B side of the target 40 and between the central permanent magnet 30 and the outermost permanent magnet 35. The third to sixth intermediate permanent magnets 31 to 34 are arranged in this order from the central permanent magnet 35.

Also, the magnet structure 130 has a first bending magnetic member 48 associated with the third and fourth intermediate permanent magnets 31 and 32, and a second bending magnetic member 49 associated with the fifth and sixth intermediate permanent magnets 33 and 34. The first and second bending magnetic members 48 and 49 are positioned at the reverse surface 40B side of the target 40.

In brief, a plurality of (two in this example) first and second bending magnetic members 48 and 49 and a plurality of (four in this example) third to sixth intermediate permanent magnets 31 to 34 (to be precise, a pair of magnets comprising the third and fourth intermediate permanent magnets 31 and 32 and a pair of magnets comprising the fifth and sixth intermediate permanent magnets 33 and 34) associated with the first and second bending magnetic members 48 and 49, are arranged in parallel between the central permanent magnet 30 and the outermost permanent magnet 35 along the reverse surface 40B of the target 40.

Specifically, the third intermediate permanent magnet 31 has an annular shape along the outer periphery of the central permanent magnet 30 in a plan view. The third intermediate permanent magnet 31 is fitted in an annular concave groove formed on the upper surface of a third base piece 43 resting on the base 41 shown in FIG. 6, with its upper portion projecting from the groove.

The third intermediate permanent magnet 31 has north and south poles producing a magnetic moment oriented in the Y-direction (i.e., the direction from the reverse surface 40B toward the obverse surface 40A of the target 40), as shown in FIG. 6. The south-pole of the third intermediate permanent magnet 31 contacts one end surface of the first bending magnetic member 48 (to be described later), while the north-pole of the third intermediate permanent magnet 31 contacts the inner surface of the groove of the third base piece 43.

The fourth intermediate permanent magnet 32 has an annular shape along the outer periphery of the third intermediate permanent magnet 31 in a plan view. The fourth intermediate permanent magnet 32 is fitted in an annular concave groove formed on the upper surface of a fourth base piece 44 resting on the base 41 shown in FIG. 6, with its upper portion projecting from the groove.

The fourth intermediate permanent magnet 32 has north and south poles producing a magnetic moment oriented in the direction opposite to the Y-direction (i.e., the direction from the obverse surface 40A toward the reverse surface 40B of the target 40), as shown in FIG. 6. The north-pole of the fourth intermediate permanent magnet 32 contacts the other end surface of the first bending magnetic member 48, while the south-pole of the fourth intermediate permanent magnet 32 contacts the inner surface of the groove of the fourth base piece 44.

The fifth intermediate permanent magnet 33 has an annular shape along the outer periphery of the fourth intermediate permanent magnet 32 in a plan view. The fifth intermediate permanent magnet 33 is fitted in an annular concave groove formed in the upper surface of a fifth base piece 45 resting on the base 41 shown in FIG. 6, with its upper portion projecting from the groove.

The fifth intermediate permanent magnet 33 has north and south poles producing a magnetic moment oriented in the Y-direction (i.e., the direction from the reverse surface 40B toward the obverse surface 40A of the target 40), as shown in FIG. 6. The south-pole of the fifth intermediate permanent magnet 33 contacts one end surface of the second bending magnetic member 49, while the north-pole of the fifth intermediate permanent magnet 33 contacts the inner surface of the groove of the fifth base piece 45.

The sixth intermediate permanent magnet 34 has an annular shape along the outer periphery of the fifth intermediate permanent magnet 33 (or the inner periphery of the outermost permanent magnet 35) in a plan view. The sixth intermediate permanent magnet 34 is fitted in an annular concave groove formed on the upper surface of a sixth base piece 46 resting on the base 41 shown in FIG. 6, with its upper portion projecting from the groove.

The sixth intermediate permanent magnet 34 has north and south poles producing a magnetic moment oriented in the direction opposite to the Y-direction (i.e., the direction from the obverse surface 40A toward the reverse surface 40B of the target 40), as shown in FIG. 6. The north-pole of the sixth intermediate permanent magnet 34 contacts the other end surface of the second bending magnetic member 49, while the south-pole of the sixth intermediate permanent magnet 34 contacts the inner surface of the groove of the sixth base piece 46.

The third to sixth base pieces 43 to 46 are made of, for example, a non-magnetic stainless steel material or a ferromagnetic stainless steel material.

The first bending magnetic member 48 (ferromagnetic member) made of a ferromagnetic stainless steel material or iron is U-bent at a substantially right angle (90 degrees). As shown in FIG. 6, the first bending magnetic member 48 has opposite end surfaces parallel with the reverse surface 40B of the target 40. One end surface contacts the south-pole end surface of the third intermediate permanent magnet 31, and the other end surface contacts the north-pole end surface of the fourth intermediate permanent magnet 32. Thus, the first bending magnetic member 48 bridges the two magnets 31 and 32.

The first bending magnetic member 48 is of a substantially elongate and annular circle shape in a plan view. More specifically, the first bending magnetic member 48 has inner and outer surfaces 48A and 48B which protrude convexly toward the reverse surface 40B of the target 40 in the thickness direction (i.e., Y-direction) of the target 40. The first bending magnetic member 48 is in the form of a half obtained by cutting an imaginary annular cylindrical body having a substantially rectangular section into halves along the end surfaces so that the dimension between the inner and outer surfaces 48A and 48B corresponds to the wall thickness of the annular cylindrical body.

For the same reason as stated in the embodiment 1, the flat portion of the outer surface 48B may be in contact with the reverse surface 40B of the target 40 or may be spaced apart from the reverse surface 40B by an appropriate clearance (not shown).

The structure of the second bending magnetic member 49 is the same as that of the first bending magnetic member 48 except that the second bending magnetic member 49 contacts the fifth and sixth intermediate permanent magnets 33 and 34. For this reason, description of the structure of the second bending magnetic member 49 will be omitted.

Description will be made of a result of analysis of a magnetic flux density distribution over the above-described target 40 magnetized, by making use of the static magnetic field simulation technique.

Figure 7:
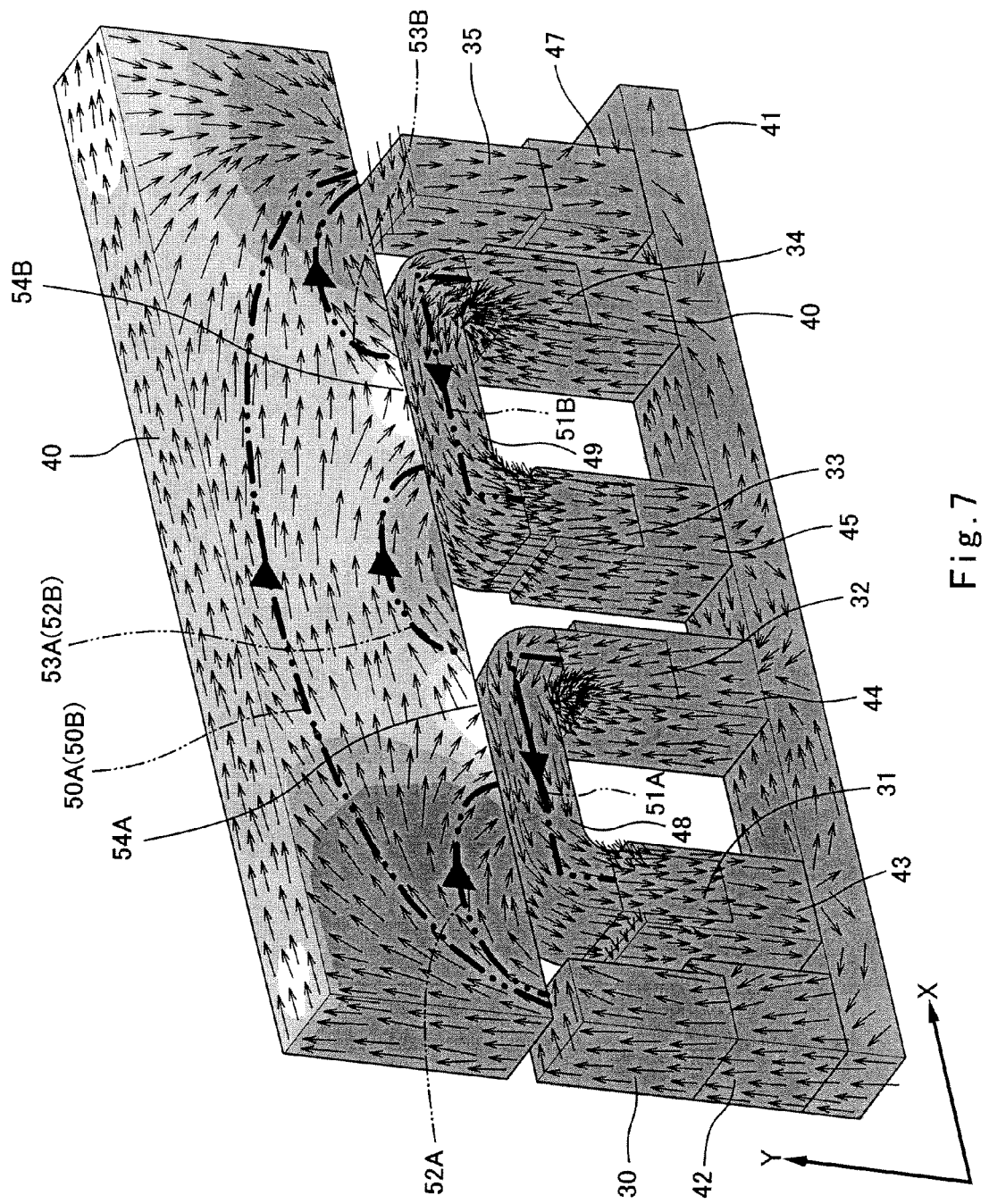
FIG. 7 is a view showing one exemplary result of analysis on the magnet structure according to the embodiment 2 by the static magnetic field simulation technique.
Figure 8:
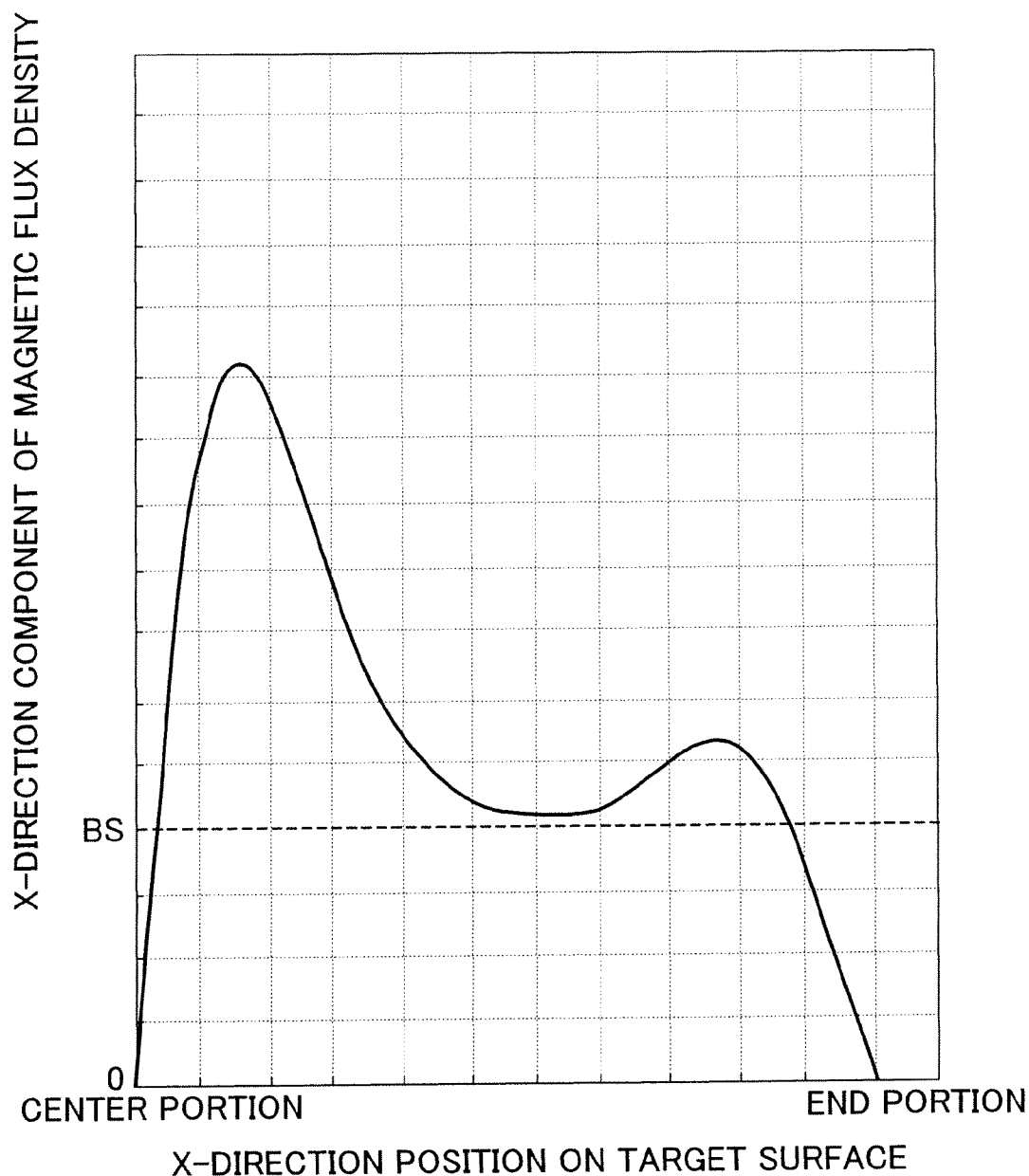
FIG. 8 is a view showing one exemplary result of analysis on the magnet structure according to the embodiment 2 by the static magnetic field simulation technique.
Figure 9:
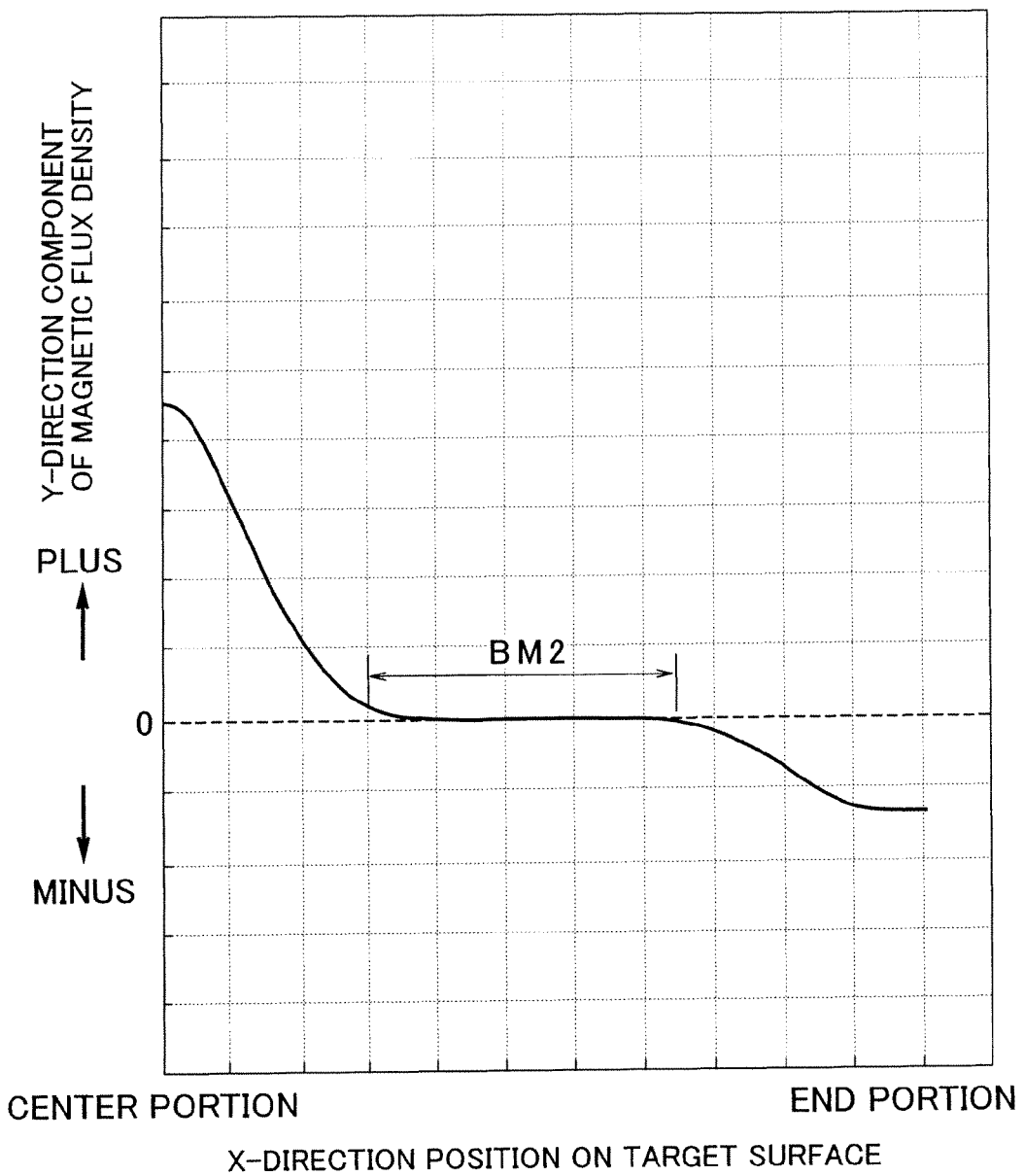
FIG. 9 is a view showing one exemplary result of analysis on the magnet structure according to the embodiment 2 by the static magnetic field simulation technique.

FIGS. 7, 8 and 9 are views each showing one exemplary result of analysis on the magnet structure according to the present embodiment by the static magnetic field simulation technique.

The details of the analytical model, analytical solver and the meaning of the result of analysis shown in each of the figures are the same as those in the embodiment 1. For this reason, description thereof will be omitted.

With reference to FIG. 7, an upper magnetic force line 50A (i.e., the first magnetic force line) and a lower magnetic force line 51A (i.e., the second magnetic force line) are produced so as to cancel each other's X-direction vector component of magnetic flux density (i.e., the components in the width direction of the target 40) within the target 40 to correspond to the first bending magnetic member 48, while an inner intermediate magnetic force line 52A (i.e., the first intermediate magnetic force line) and an outer intermediate magnetic force line 53A (i.e., the third intermediate magnetic force line) are produced within the target 40 so as to cancel each other's Y-direction vector component of magnetic flux density (i.e., the components in the thickness direction of the target 40).

Likewise, an upper magnetic force line 50B (i.e., the first magnetic force line) and a lower magnetic force line 51B (i.e., the second magnetic force line) are produced so as to cancel each other's X-direction vector component of magnetic flux density (i.e., the components in the width direction of the target 40) within the target 40 to correspond to the second bending magnetic member 49, while an inner intermediate magnetic force line 52B (i.e., the third intermediate magnetic force line) and an outer intermediate magnetic force line 53B (i.e., the second intermediate magnetic force line) are produced within the target 40 so as to cancel each other's Y-direction vector component of magnetic flux density (i.e., the components in the thickness direction of the target 40).

Specifically, the upper magnetic force line 50A emanates from the north pole of the central permanent magnet 30, reaches the obverse surface 40A of the target 40, extends substantially in parallel with the X-direction in an inside portion of the target 40 that lies above a first zero point 54A at which the Y-direction vector component of magnetic flux density and the X-direction vector component of magnetic flux density become substantially zero, and enters the south pole of the outermost permanent magnet 35 while curving like an arch within the target 40.

The lower magnetic force line 51A emanates from the north pole of the fourth intermediate permanent magnet 32, extends substantially in parallel with the direction opposite to the X-direction while being confined in an inside portion of the U-shaped first bending magnetic member 48 that lies just below the first zero point 54A, and enters the south pole of the third intermediate permanent magnet 31 while bending at substantially 90 degrees at two points to conform to the shape of the first bending magnetic member 48.

Here, a magnetic circuit is formed to include the lower magnetic force line 51A, magnetic force lines each passing through the inside of the third and fourth intermediate permanent magnets 31 and 32, and a magnetic force line passing through the inside of the base 41.

The inner intermediate magnetic force line 52A emanates from the north pole of the central permanent magnet 30, reaches an intermediate point in the thickness direction of the target 40, extends to bend like an arch within the target 40, passes through a portion of the target 40 that lies beside the first zero point 54A (location on the minus side in the X-direction with respect to the first zero point 54A) substantially in parallel with the direction opposite to the Y-direction, and enters the first bending magnetic member 48.

The outer intermediate magnetic force line 53A emanates from the first bending magnetic member 48, passes through a portion of the target 40 that lies beside the first zero point 54A (location on the plus side in the X-direction with respect to the first zero point 54A) substantially in parallel with the Y-direction, reaches an intermediate point in the thickness direction of the target 40, extends to bend like an arch within the target 40, and enters the second bending magnetic member 49.

Specifically, the upper magnetic force line 50B emanates from the north pole of the central permanent magnet 30, reaches the obverse surface 40A of the target 40, extends substantially in parallel with the X-direction in an inside portion of the target 40 that lies just above a second zero point 54B at which the Y-direction vector component of magnetic flux density and the X-direction vector component of magnetic flux density become substantially zero, and enters the south pole of the outermost permanent magnet 35 while curving like an arch within the target 40.

The lower magnetic force line 51B emanates from the north pole of the sixth intermediate permanent magnet 34, extends substantially in parallel with the direction opposite to the X-direction while being confined in an inside portion of the U-shaped second bending magnetic member 49 that lies just below the second zero point 54B, and enters the south pole of the fifth intermediate permanent magnet 33 while bending at substantially 90 degrees at two points to conform to the shape of the second bending magnetic member 49.

Here, a magnetic circuit is formed to include the lower magnetic force line 51B, magnetic force lines each passing through the inside of the fifth and sixth intermediate permanent magnets 33 and 34, and a magnetic force line passing through the inside of the base 41.

The inner intermediate magnetic force line 52B emanates from the first bending magnetic member 48, reaches an intermediate point in the thickness direction of the target 40, extends to bend like an arch within the target 40, passes through a portion of the target 40 that lies beside the second zero point 54B (location on the minus side in the X-direction with respect to the second zero point 54B) substantially in parallel with the direction opposite to the Y-direction, and enters the second bending magnetic member 49.

The outer intermediate magnetic force line 53B emanates from the second bending magnetic member 49, passes through a portion of the target 40 that lies beside the second zero point 54B (location on the plus side in the X-direction with respect to the second zero point 54B) substantially in parallel with the Y-direction, reaches an intermediate point in the thickness direction of the target 40, extends to bend like an arch within the target 40, and enters the south pole of the outermost permanent magnet 35.

As can be easily understood from FIG. 7, in the magnet structure 130 according to the present embodiment, the upper magnetic force line 50A and the upper magnetic force line 50B are produced continuously within the target 40 as magnetic force lines respectively corresponding to the first and second zero points 54A and 54B. Also, the outer intermediate magnetic force line 53A and the inner intermediate magnetic force line 52B are produced continuously within the target 40 as magnetic force lines respectively corresponding to the first and second zero points 54A and 54B.

As shown in FIG. 7, the first zero point 54A at which the Y-direction vector component of magnetic flux density and the X-direction vector component of magnetic flux density become substantially zero is formed within the region surrounded by the magnetic force lines 50A to 53A, while the second zero point 54B at which the Y-direction vector component of magnetic flux density and the X-direction vector component of magnetic flux density become substantially zero is formed within the region surrounded by the magnetic force lines 50B to 53B. In this example, the first and second zero points 54A and 54B are located in the vicinity of contact surfaces between the reverse surface 40B of the target 40 and the first and second bending magnetic members 48 and 49.

By thus positioning the first and second zero points 54A and 54B at respective locations optimum to the constitution of the target 40 (thickness, material and the like), it is possible to adjust the leakage magnetic field for plasma confinement produced over the obverse surface 40A of the target 40 properly.

As can be seen from FIG. 8, the magnet structure 130 described above is capable of maintaining the X-direction component of magnetic flux density (i.e., the component in the width direction of the target 40) on the obverse surface 40A of the target 40 to a value not less than a predetermined magnetic flux density BS (e.g., 200 to 300 G) over substantially the entire X-direction region of the obverse surface 40A of the target 40. As a result, efficient and wide erosion of the target 40 can be achieved advantageously.

Furthermore, as can be seen from FIG. 9, a flat region BM2 at which the Y-direction component of magnetic flux density (i.e., the component in the thickness direction of the target 40) on the obverse surface 40A of the target 40 becomes substantially zero, can be formed over a wider range in the X-direction of the obverse surface 40A of the target 40 than the flat region BM1 formed by the embodiment 1 (see FIG. 5). As a result, effective utilization of magnetic energy and wider erosion of the target 40 can be achieved advantageously.

Thus, according to the magnet structure 130 of the present embodiment, two quadridirectional magnetic fields are produced: one comprising the upper magnetic force line 50A, the lower magnetic force line 51A, the inner intermediate magnetic force line 52A and the outer intermediate magnetic force line 53A which surround the first zero point 54A existing at a suitable location in the target 40 (for example, a location in the vicinity of the reverse surface 40B), and the other comprising the upper magnetic force line 50B, the lower magnetic force line 51B, the inner intermediate magnetic force line 52B and the outer intermediate magnetic force line 53B which surround the second zero point 54B existing at a suitable location in the target 40 (for example, a location in the vicinity of the reverse surface 40B). Therefore, wide erosion can be achieved with localized sputtering of the target 40 suppressed, thereby increasing the target utilization efficiency, hence, prolonging the target change periods. Thus, the magnet structure 130 can contribute to an improvement in the operating efficiency of the planar-type magnetron sputtering system.

According to the present embodiment, the lower magnetic force lines 51A and 51B of the two quadridirectional magnetic fields comprising the upper magnetic force lines 50A and 50B, the lower magnetic force lines 51A and 51B, the inner intermediate magnetic force lines 52A and 52B and the outer intermediate magnetic force lines 53A and 53B, are confined within the first and second bending magnetic members 48 and 49, respectively. For this reason, the paths of the lower magnetic force lines 51A and 51B are each fixed so as to extend to conform to the shape of the associated one of the first and second bending magnetic members 48 and 49. Therefore, it is possible to reduce the number of magnet design parameters for the respective magnets producing such quadridirectional magnetic fields, thereby to reduce the labor required to make a magnet design for producing a well-balanced magnetic field.

In the present embodiment, plural sets (two sets illustrated here) of a bending magnetic member and associated pair of intermediate permanent magnets, i.e., the set of the first bending magnetic member 48 and its associated pair of third and fourth intermediate permanent magnets 31 and 32 and the set of the second bending magnetic member 49 and its associated pair of fifth and sixth intermediate permanent magnets 33 and 34, are arranged in parallel between the central permanent magnet 30 and the outermost permanent magnet 35 along the reverse surface 40B of the target 40.

Thus, the present embodiment advantageously enables a magnet design to be made in which plural (two in this example) bending magnetic members for confining the lower magnetic force lines (and their associated pairs of magnets) can be arranged along the reverse surface 40B of the target 40 according to the width of the target 40. Here, the number of bending magnetic members may be limited to one or not less than three depending on the width of the target 40.

It will be apparent from the foregoing description that many improvements and other embodiments of the present invention may occur to those skilled in the art. Therefore, the foregoing description should be construed as an illustration only and is provided for the purpose of teaching the best mode for carrying out the present invention to those skilled in the art. The details of the structure and/or the function of the present invention can be modified substantially without departing from the spirit of the present invention.

The magnet structure according to the present invention is, for example, useful as magnetic field producing device for use in a magnetron sputtering system.

The invention claimed is:

1. A magnet structure for magnetron sputtering, comprising:
    inner and outer permanent magnets positioned at a reverse surface side of a target such that a magnetic moment orientation of the inner permanent magnet becomes different from a magnetic moment orientation of the outer permanent magnet for producing a first magnetic force line reaching an obverse surface of the target;
    a pair of intermediate permanent magnets positioned at the reverse surface side of the target and between the inner and outer magnets such that a magnetic moment orientation of one of the pair of intermediate magnets becomes different from a magnetic moment orientation of the other of the pair of intermediate magnets for producing a second magnetic force line acting to cancel a magnetic flux density component, in a width direction of the target, that is produced by the first magnetic force line; and
    a magnetic member positioned at the reverse surface side of the target to guide the second magnetic force line emanating from an end surface of one of the pair of intermediate permanent magnets into an end surface of the other of the pair of intermediate permanent magnets, the magnetic member being shaped convexly protruding toward the reverse surface of the target,
    wherein the magnetic member is configured to produce a magnetic force line reaching an intermediate point in a thickness direction of the target in association with the inner magnet or the outer magnet.

2. The magnet structure according to claim 1, wherein the inner permanent magnet and the magnetic member cooperate with each other to produce a first intermediate magnetic force line reaching an intermediate point in the thickness direction of the target, and the outer permanent magnet and the magnetic member cooperate with each other to produce a second intermediate magnetic force line reaching an intermediate point in the thickness direction of the target so as to cancel a magnetic flux density component in the thickness direction of the target which is produced by the first intermediate magnetic force line.

3. The magnet structure according to claim 2, wherein a zero point, at which values of magnetic flux densities in the width direction and the thickness direction which are obtained by the first magnetic force line, the second magnetic force line, the first intermediate magnetic force line and the second intermediate magnetic force line become substantially zero, is formed within a region surrounded by the magnetic force lines.

4. The magnet structure according to claim 1, wherein plural sets of the magnetic member and the pair of intermediate permanent magnets associated with the magnetic member are arranged in parallel between the inner permanent magnet and the outer permanent magnet along a reverse surface of the target.

5. The magnet structure according to claim 4, wherein:
    the inner permanent magnet and a first magnetic member located adjacent the inner permanent magnet cooperate with each other to produce a first intermediate magnetic force line reaching an intermediate point in the thickness direction of the target; and
    the outer permanent magnet and a second magnetic member located adjacent the outer permanent magnet cooperate with each other to produce a second intermediate magnetic force line reaching an intermediate point in the thickness direction of the target.

6. The magnet structure according to claim 5, wherein the first magnetic member and the second magnetic member cooperate with each other to produce a third intermediate magnetic force line reaching an intermediate point in the thickness direction of the target so as to cancel magnetic flux density components in the thickness direction of the target which are respectively produced by the first intermediate magnetic force line and the second intermediate magnetic force line.

7. The magnet structure according to claim 6, wherein:
    a first zero point, at which values of magnetic flux densities in the width direction and the thickness direction which are obtained by the first magnetic force line, the second magnetic force line, the first intermediate magnetic force line and the third intermediate magnetic force line become substantially zero, is formed within a region surrounded by the magnetic force lines; and a second zero point, at which values of magnetic flux densities in the width direction and the thickness direction which are obtained by the first magnetic force line, the second magnetic force line, the second intermediate magnetic force line and the third intermediate magnetic force line become substantially zero, is formed within a region surrounded by the magnetic force lines.

8. The magnet structure according to claims 1, wherein the magnetic member contacts the end surfaces of the pair of intermediate permanent magnets associated with the magnet member.

9. The magnet structure according to claim 8, wherein the magnetic member is curved like an arch.

10. The magnet structure according to claim 8, wherein the magnetic member is bent at a substantially right angle.

11. A cathode electrode unit for magnetron sputtering, comprising: a target, wherein the target is made of a non-magnetic metal; the magnet structure as recited in claim 1, which is positioned at a reverse surface side of the target; and an electric power source for supplying a predetermined electric power to the target.

12. A magnetron sputtering system comprising a vacuum chamber accommodating therein the cathode electrode unit as recited in claim 11 and a substrate opposed to the target of the cathode electrode unit, the vacuum chamber being capable of reducing an internal pressure thereof.

* * * * *

UNITED STATES PATENT AND TRADEMARK OFFICE
CERTIFICATE OF CORRECTION

PATENT NO. : 8,608,918 B2  
APPLICATION NO. : 12/067908  
DATED : December 17, 2013  
INVENTOR(S) : Takahiko Kondo et al.

Page 1 of 1

It is certified that error appears in the above-identified patent and that said Letters Patent is hereby corrected as shown below:

In the Claims

At Column 19, line 8, "claims 1," should be -- claim 1, --.

Signed and Sealed this  
Fifth Day of May, 2015

Michelle K. Lee  
*Director of the United States Patent and Trademark Office*